(12) United States Patent
Lee et al.

(10) Patent No.: US 11,373,887 B2
(45) Date of Patent: Jun. 28, 2022

(54) HEAT TREATMENT METHOD OF SUBSTRATE AND APPARATUS THEREOF

(71) Applicant: SEMES CO., LTD., Cheonan-si (KR)

(72) Inventors: Sung Yong Lee, Anyang-si (KR); Sang Bok Han, Asan-si (KR); Dong Hyuk Seo, Cheonan-si (KR); Bong Kuk Kim, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 150 days.

(21) Appl. No.: 16/578,282

(22) Filed: Sep. 21, 2019

(65) Prior Publication Data

US 2020/0105549 A1  Apr. 2, 2020

(30) Foreign Application Priority Data

Sep. 28, 2018 (KR) .................. 10-2018-0116406

(51) Int. Cl.
| | |
|---|---|
| *F24D 11/00* | (2022.01) |
| *H05B 3/68* | (2006.01) |
| *H01L 21/67* | (2006.01) |
| *H01L 21/66* | (2006.01) |
| *H01L 21/324* | (2006.01) |

(52) U.S. Cl.
CPC ...... *H01L 21/67103* (2013.01); *H01L 21/324* (2013.01); *H01L 21/67248* (2013.01); *H01L 22/30* (2013.01)

(58) Field of Classification Search
CPC ............ H01L 21/324; H01L 21/67103; H01L 21/67248; H01L 22/30; H01L 21/67063; H01L 21/67213; H01L 21/6833; H01L 21/687; H01L 21/68714; H01L 21/68742; H01L 21/68785; G01K 7/183; H01J 2237/334; H01J 37/32724; H05B 1/0233
USPC ....................................... 219/385, 444.1–468
See application file for complete search history.

(56) References Cited

U.S. PATENT DOCUMENTS

| | | | |
|---|---|---|---|
| 7,755,003 B2 | 7/2010 | Ookura et al. | |
| 7,868,270 B2* | 1/2011 | Ookura | ............. H01L 21/67178 219/448.11 |
| 2007/0010403 A1* | 1/2007 | Nanno | ................ G05D 23/1917 505/430 |
| 2008/0156785 A1* | 7/2008 | Ookura | ............. H01L 21/67248 219/162 |
| 2016/0345384 A1* | 11/2016 | Zhang | ..................... H01L 22/20 |

FOREIGN PATENT DOCUMENTS

| | | |
|---|---|---|
| KR | 10-2008-0074750 | 8/2008 |
| KR | 10-2010-0055775 | 5/2010 |
| KR | 10-1227765 | 1/2013 |

OTHER PUBLICATIONS

Office Action from Korean Intellectual Patent Office.

* cited by examiner

*Primary Examiner* — Sang Y Paik

(57) ABSTRACT

A heat treatment method of a substrate includes setting a temperature profile over the course of stabilization to a target temperature after the substrate is loaded as a reference, and controlling a temperature of the hot plate supporting the substrate on the basis of the reference.

9 Claims, 5 Drawing Sheets

HEAT TREATMENT METHOD OF SUBSTRATE AND APPARATUS THEREOF

CROSS REFERENCE TO RELATED APPLICATION

The present application claims priority to Korean Patent Application No. 10-2018-0116406, filed Sep. 28, 2018, the disclosure of which is incorporated by reference herein in its entirety.

BACKGROUND OF THE INVENTION

Field of the Invention

The present invention relates to a heat treating method of a substrate for performing heat treating of a substrate such as a semiconductor wafer and a method thereof.

Description of the Related Art

In a photolithography process of semiconductor device fabrication, a heat treating process (baking process) is performed to cure a resist film coated on a substrate or to dry a cleaned substrate.

A heat treatment apparatus used in the heat treatment process usually includes a hot plate that has a heater as a heat source. Accordingly, to apply heat from the heater to the substrate, the substrate to be subjected to the heat treatment process is mounted on the hot plate.

Meanwhile, in a case where the substrate is loaded on the hot plate maintained at a process temperature, the substrate itself may disturb or change the process temperature of the hot plate, and thus a controller may control the heat source so that the hot plate with the substrate may reach the process temperature again. That is, such control is performed by setting the process temperature to a target temperature. However, as shown in FIG. 1, according to a control method in the related art as described above, the disturbed temperature may overshoot above the target temperature before the hot plate with the substrate is stabilized to the target temperature. Additionally, even in a case where the disturbance in the process temperature is different according to the locations of the hot plate, due to the fact that temperature control is performed by setting the same target temperature irrespective of the difference of the temperature disturbance, the hot plate may undergo different changes in temperature during the temperature control according to the locations of the hot plate, which may cause process variations on the hot plate.

Furthermore, in the control method in the related art, due to the fact that temperature control is performed by setting one target temperature, it is difficult to control the overall temperature profile involving a temperature decrease rate, a temperature increase rate, and the like to a desired temperature profile.

The foregoing is intended merely to aid in the understanding of the background of the present invention, and is not intended to mean that the present invention falls within the purview of the related art that is already known to those skilled in the art.

Documents of Related Art (Patent document 1) Korean Patent Application Publication No. 10-2010-0055775

SUMMARY OF THE INVENTION

Accordingly, the present invention has been made keeping in mind the above problems occurring in the related art, and an objective of the present invention is to provide a heat treating method of a substrate, in which a temperature profile itself in which a temperature of a hot plate reaches a target temperature after the substrate is loaded on the hot plate is used as a process variable in temperature control.

The objectives of the present invention are not limited to the above-mentioned objective, and other objectives and advantages of the present invention which are not mentioned can be understood by the following description.

According to an exemplary embodiment of the present invention, a heat treatment method of a substrate includes loading a substrate on a hot plate, setting a temperature profile including a plurality of preliminary target temperatures as a reference, and controlling a temperature of the hot plate supporting the substrate on the basis of the reference so that the hot plate is controlled to have the plurality of preliminary target temperatures over the course of stabilization to a target temperature.

According to an exemplary embodiment of the present invention, a heat treatment apparatus of a substrate includes a hot plate supporting the substrate, a heater configured to heat the hot plate, a temperature sensor configured to detect a temperature of the hot plate and a controller configured to control the heater so that a temperature of the hot plate is controlled in a stepwise manner.

The effects of the present invention are not limited to the above-mentioned effects, and it should be understood that the effects of the present invention include all effects that can be inferred from the configuration of the invention described in the detailed description of the invention or the appended claims.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

Figure 1:
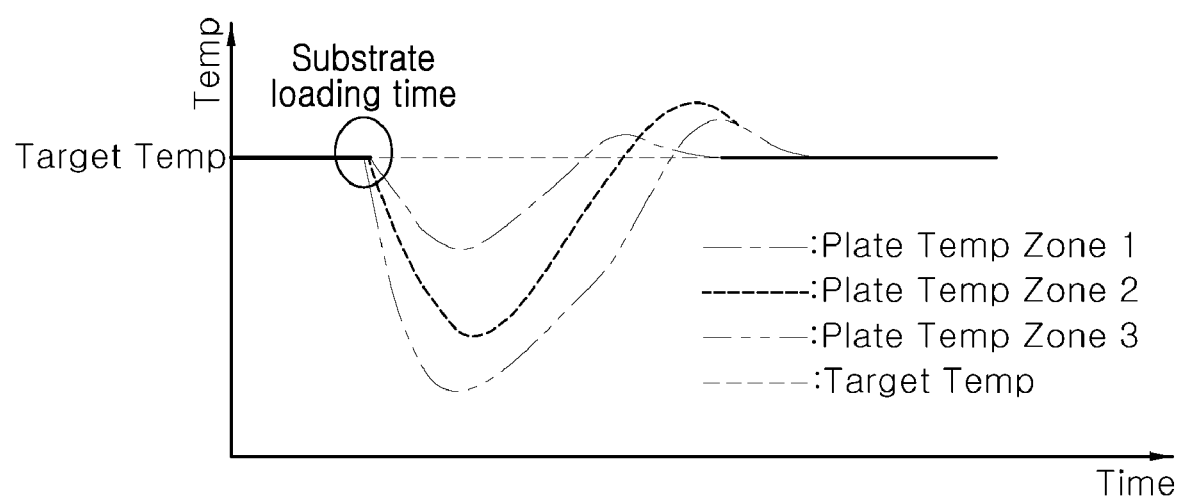
FIG. 1 is a graph showing temperature distribution according to a heat treating method in the related art.

Hereinbelow, exemplary embodiments of the present invention will be described in detail with reference to the accompanying drawings.

The present invention, however, is not limited to only the embodiments set forth herein, and those skilled in the art will appreciate that the present invention can be embodied in many alternate forms.

In the following description, it is to be noted that, when the functions of conventional elements and the detailed description of elements related with the present invention may make the gist of the present invention unclear, a detailed description of those elements will be omitted. Throughout the drawings, the same reference numerals will refer to the same or like parts.

Unless the context clearly indicates otherwise, it will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. The terminology used herein is for the purpose of describing exemplary embodiments only and is not intended to limit the present invention thereto. Unless otherwise defined, all terms including technical and scientific terms used herein have the same meaning as commonly understood by one of ordinary skill in the art to which this invention belongs.

Figure 2:
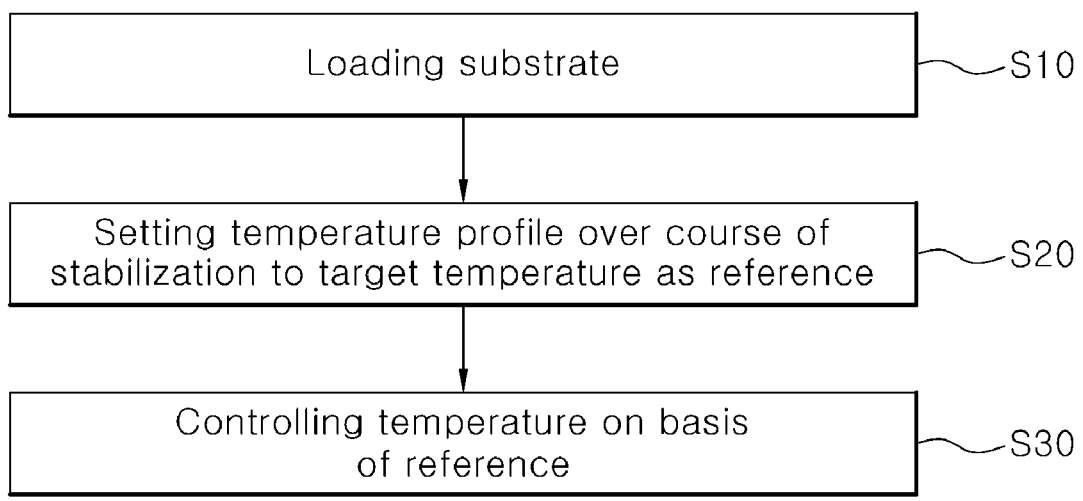
FIG. 2 is a flowchart showing a heat treating method of a substrate according to an embodiment of the present invention.

FIG. 2 is a view showing a temperature control method of a hot plate in a heat treatment apparatus according to an exemplary embodiment of the present invention.

Referring to FIG. 2, the temperature control method of the hot plate includes setting, after loading the substrate (S10), a temperature profile over the course of stabilization to a target temperature (S20) as a reference, and controlling the temperature of the hot plate on the basis of the reference (S30). Herein, the temperature profile denotes the shape of a curve of changes in temperature as a function of time, and the reference denotes a reference of temperature control.

In detail, S10 is a step of loading the substrate onto the hot plate. In an exemplary embodiment, the hot plate, before the substrate is loaded, is kept at a target temperature (for example, a process temperature). The present invention is not limited thereto.

In an exemplary embodiment, the hot plate may be kept at a temperature lower than the process temperature. When the substrate is loaded, the substrate acts as a disturbance to the target temperature of the hot plate and the temperature of the hot plate is changed or disturbed due to the substrate.

In the related art, the temperature of the hot plate thus changed is controlled to reach the target temperature again, and a temperature profile for an intermediate step of such temperature control is not precisely controlled. For example, when it is detected that the temperature of the hot plate is lower than the target temperature after the substrate is loaded, electric power is applied to a heater of the hot plate on the basis of degree of the detected temperature difference. When it is detected that the temperature of the hot plate approaches the target temperature or the temperature of the hot plate increases above the target temperature (i.e., overshooting of the temperature occurs), electric power applied to the heater is cut off. However, in such a control method in the related art, only one target temperature is used as a reference. Due to this, it is difficult to prevent occurrence of overshooting, and it is also difficult to control temperature profiles of the hot plate and the substrate to desired temperature profiles. Additionally, in a case where the hot plate has different temperature deviations according to the locations thereof, it is difficult to control a temperature profile of the hot plate, resulting in process variations across the substrate on the hot plate.

On the other hand, in the temperature control method of the hot plate in a heat treatment process of a substrate according to the embodiment of the present invention, the temperature profile over the course of stabilization to the target temperature is set as the reference (S20), and the temperature of the hot plate with the substrate is controlled on the basis of the reference (S30). That is, the temperature of the hot plate with the substrate is controlled such that the temperature of the substrate is changed to conform to a desired temperature profile. Therefore, unlike the case where temperature control is performed by setting only a target temperature as a reference, it is possible that occurrence of overshooting is minimized and the temperature profile itself is used as a process variable in temperature control.

Figure 5:
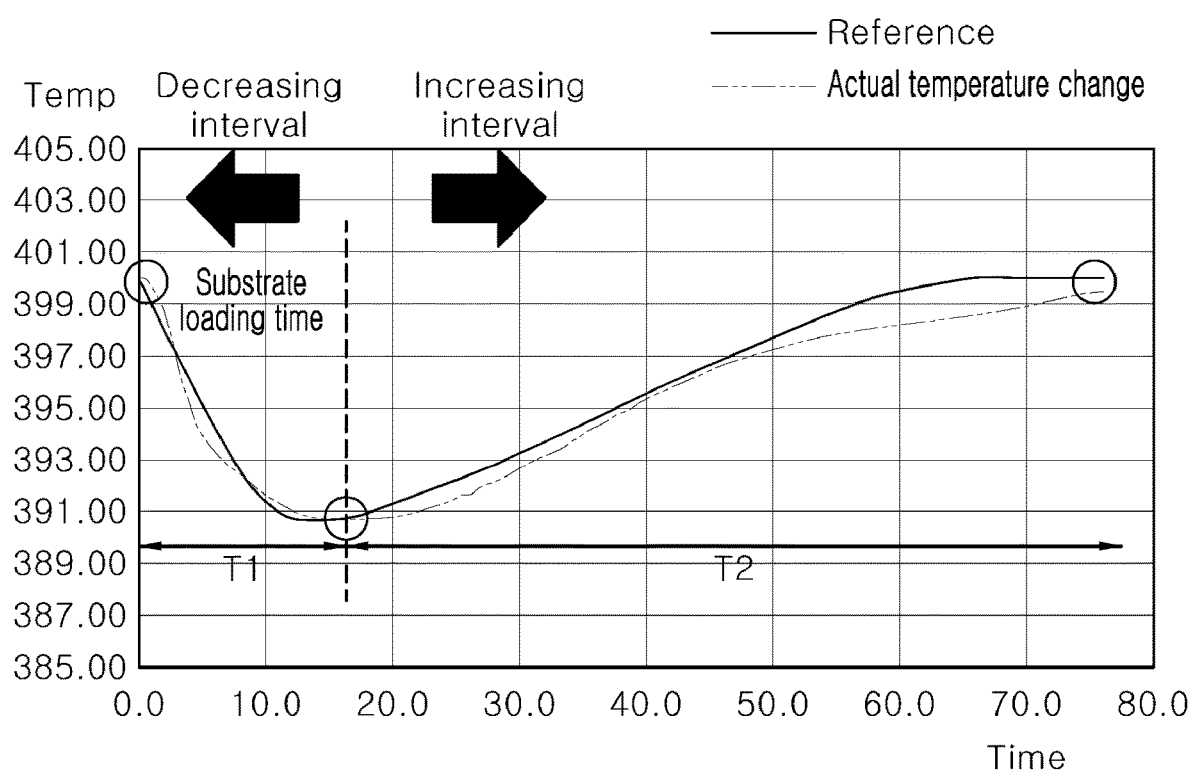
FIG. 5 is a graph showing a temperature profile according to the heat treating method of the substrate according to the embodiment of the present invention.

The steps of S20 and S30 will be described in detail. The reference may be configured in the form of an expression (e.g., a polynomial mathematical expression) representing the temperature profile. That is, an expression for temperature as a function of time is set as a reference, and the temperature control method is performed in such a manner that a temperature corresponding to a time is set as an interval target temperature. For example, the temperature control method may be performed in a stepwise way in which the temperature profile of the reference may include a plurality of preliminary target temperatures in a predefined temporal distribution as shown in FIG. 5, which will be described in detail. In an exemplary embodiment, the preliminary target temperatures may be lower than the target temperature.

Alternatively, the reference may be configured in the form of a lookup table in which time and temperature are mapped to each other, instead of an expression form. That is, in a lookup table, the preliminary target temperatures are mapped to corresponding times, and control is performed in such a manner that the preliminary target temperatures are obtained. In an exemplary embodiment, for a time which is not stored in the lookup table, interpolation between adjacent data samples is performed to calculate an interpolated preliminary target temperature.

In an exemplary embodiment, the reference may be set for each hot plate zone. For example, due to a structural problem of a chamber or the hot plate, there is a case where controlling the entire zone of the hot plate on the basis of one reference (temperature profile) may not be able to uniformly control the temperature of a substrate on a per-zone basis. In this case, by setting different temperature profiles as references for different hot plate zones to undergo different temperature changes, it is possible that the temperature of the substrate on the hot plate is uniformly controlled. For example, each hot plate zone may be independently set to have a temperature profile as a reference.

Additionally, by setting the reference differently for each zone of the hot plate, a temperature profile itself may be used as a process variable. For example, in a case where it is rather undesirable to provide the same temperature profile due to differences in film thickness, pattern size, and the like for each substrate zone, a different temperature profile may be set as a reference for each zone, and which may enable temperature control to be implemented in a direction process irregularities are eliminated.

Furthermore, the reference according to the embodiment of the present invention may be set for only a part of a time interval during which the preliminary target temperature is reached. For example, when the substrate is loaded in a state where the hot plate is heated to a target temperature for process, for example, 400° C., the temperature of the hot plate decreases, and after a predetermined time elapses, the temperature again increases and stabilizes at the target temperature. That is, the temperature of the hot plate may be divided into a temperature decreasing interval and a temperature increasing interval. At this time, temperature control may be implemented by setting as a reference a temperature profile in only any one of the temperatures decreasing interval and the temperature increasing interval. Furthermore, as occasion demands, each of the temperature decreasing interval and the temperature increasing interval may be subdivided into subdivision intervals, and a temperature profile may be set as a reference for each subdivision interval.

Figure 3:
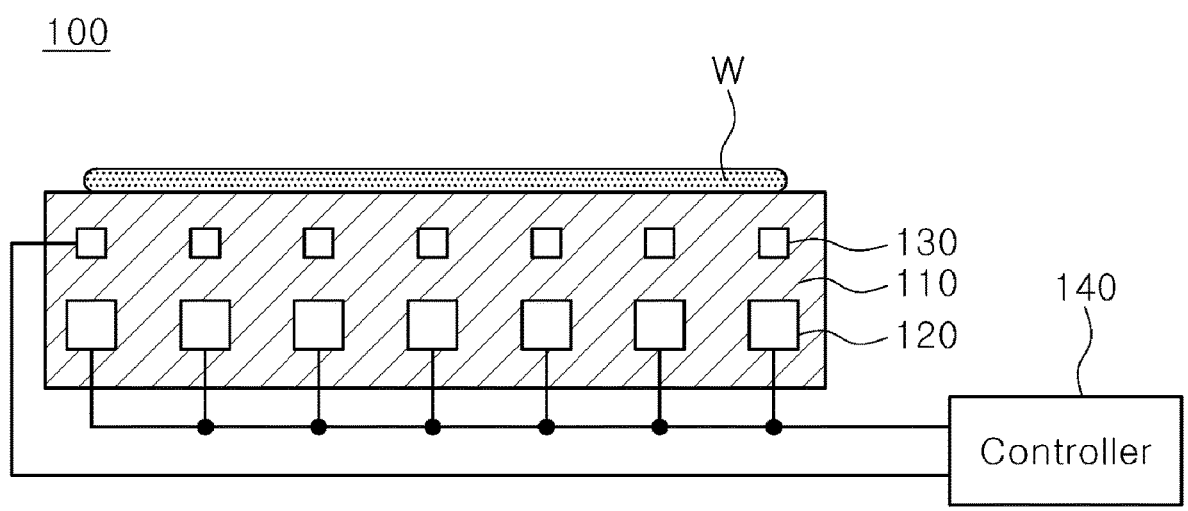
FIG. 3 is a block diagram showing a heat treating apparatus of a substrate according to an embodiment of the present invention.
Figure 4:
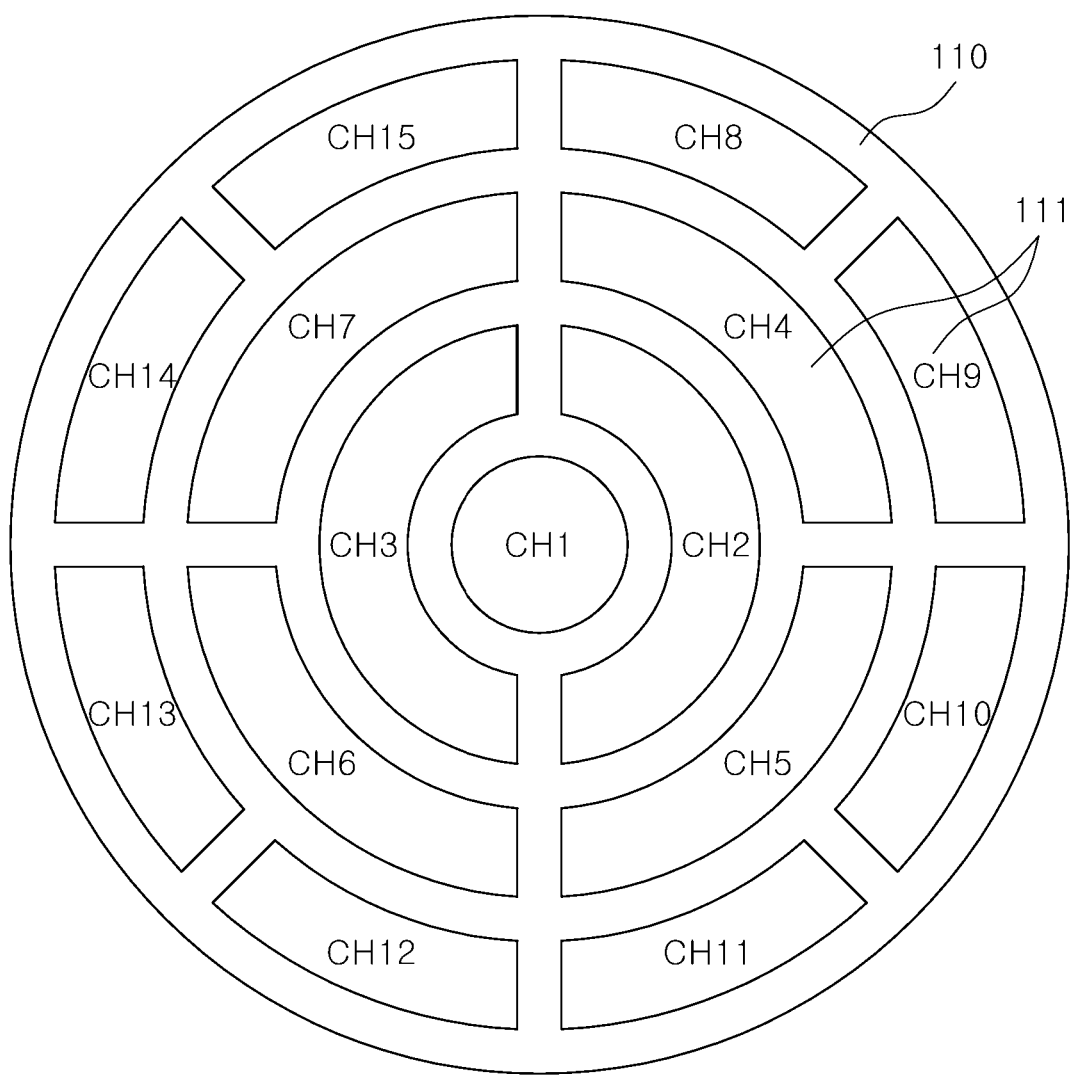
FIG. 4 is a plan view showing the heat treating apparatus of the substrate according to the embodiment of the present invention.

FIGS. 3 and 4 each show a heat treatment apparatus of a substrate according to an exemplary embodiment of the present invention. For example, FIG. 3 shows a hot plate assembly for controlling a spatial temperature distribution on a hot plate and FIG. shows a zone configuration of the hot plate according to an exemplary embodiment.

Referring to FIGS. 3 and 4, the hot plate assembly 100 includes a hot plate 110 on which a substrate W is loaded, a heater 120 disposed inside the hot plate 110 to heat the hot plate 110, a temperature sensor 130 for detecting the temperature of the hot plate 110, and a controller 140 for controlling the heater 120.

The hot plate 110 supports the substrate W that is loaded on an upper surface thereof and transfers heat provided from the heater 120 to the substrate W. The hot plate 110 may be divided into multiple zones. At this time, the temperature for each of the zones may be independently controlled. In an exemplary embodiment, the heater 120 may include a plurality of sub-heaters, and each of the plurality of sub-heaters may be disposed in a corresponding zone. Each of the sub-heaters may be independently controlled, thereby independently controlling a target temperature and a transient temperature profile of each zone.

For example, the hot plate 110 may have multiple channels 111 radially arranged from a center thereof, and each of the sub-heaters in the heater 120 may be disposed in a corresponding channel of the channels 111. Each of sub-heaters of the heater 120 may be independently controlled to supply a corresponding thermal energy to a corresponding zone of the zones of the hot plate 110 to increase the temperature of the corresponding zone according to a target temperature and a transient temperature profile set to the corresponding zone. As a result, the hot plate 110 and the substrate W may be heated together so that the substrate W is subjected to a spatial temperature distribution and a temporal temperature profile which are defined in the reference.

In detail, referring to FIG. 4, the hot plate 110 includes multiple channels, for example, first to fifteenth channels CH1 to CH15, which are arranged on multiple zones. In an exemplary embodiment, the channels CH1 to CH15 of the hot plate 110 may be set to have the same reference to control the overall temperature of the hot plate 110.

The present invention is not limited thereto. In an exemplary embodiment, each of the zones for temperature control may be performed on a per-zone basis using multiple channels. For example, the zone of the hot plate may be divided into a center zone, a middle zone, and an edge zone, and a reference may be set differently for each zone. The center zone, the middle zone and the edge zone may be concentric. Referring to FIG. 4, the center zone may include CH1 to CH3, the middle zone may include CH4 to CH7, and the edge zone may include CH8 to CH15.

Temperature sensors 130 are provided in the hot plate 110. In an exemplary embodiment, each of the temperature sensors 130 may be associated with a corresponding one of the sub-heaters in the heater 120 and may detect temperatures of the sub-heaters of the heater 120 to provide the detected temperatures to the controller 140.

The controller 140 receives the detected temperatures from the temperature sensors 130 of the hot plate 110 and controls the sub-heaters of the heater 120 to allow the detected temperatures to match interval target temperatures based on a reference. The controller 140 may include a storage unit in which the reference is stored in the form of an expression or a lookup table and may independently control the sub-heaters in the heater 120 provided in the channels CH1 to CH15 on the basis of the reference.

The reference may be input by a user during a process or may be configured such that any one of multiple references that are stored in the heat treating apparatus is selected.

FIG. 5 is a graph showing a result of controlling the temperature of the hot plate according to the heat treating method of the substrate according to the embodiment of the present invention. The solid line is the reference and the dashed line is the actual temperature change graph.

Referring to FIG. 5, when the substrate W is loaded on the hot plate controlled to the target temperature, the temperature of the hot plate decreases because the hot plate loses heat to the substrate, and then the temperature of the hot plate gradually returns to the target temperature. In detail, when the substrate is loaded on the hot plate, the temperature of the hot plate decreases during an interval of T1 from a substrate loading time, and then the temperature of the hot plate increases again during an interval of T2 and stabilizes at the target temperature. Therefore, the interval of T1 after loading of the substrate is defined as the temperature decreasing interval, and the interval of T2 in which the temperature increases thereafter and stabilizes is defined as the temperature increasing interval.

As such, a desired temperature profile is set as a reference for each time interval, and the temperature of the hot plate is controlled on the basis of the reference. At this time, the reference may be set in the form of an expression for temperature as a function of time or may be set in the form of a lookup table of interval target temperature as a function of time.

Since the temperature of the hot plate is controlled on the basis of the reference as described above, as shown in FIG. 5, temperature distribution of the hot plate is similar to temperature distribution of the reference during an actual process.

Therefore, when the temperature is controlled on the basis of the reference according to the embodiment of the present invention, it is possible that temperature uniformity is easily secured for each zone of the hot plate.

Those who are ordinarily skilled in the art will appreciate that various alternatives, modifications, and equivalents are possible, without changing the spirit or essential features of the present invention. Therefore, the exemplary embodiments of the present invention have been described for illustrative purposes, and should not be construed as being restrictive.

The scope of the present invention is defined by the accompanying claims rather than the description which is presented above. Moreover, the present invention is intended to cover not only the exemplary embodiments, but also various alternatives, modifications, equivalents and other embodiments that may be included within the spirit and scope of the present invention as defined by the appended claims.

What is claimed is:

1. A heat treatment method of a substrate, the method comprising:

loading a substrate on a hot plate;

setting a temperature profile including a plurality of first preliminary target temperatures in a temperature decreasing interval and a plurality of second preliminary target temperatures in a temperature increasing interval as a reference, wherein the plurality of first preliminary target temperatures decrease in the temperature decreasing interval such that the temperature of the substrate conforms to a temperature profile of the plurality of first preliminary target temperatures, and then the plurality of the second preliminary target temperatures increase in the temperature increasing interval such that the temperature of the substrate conforms to a temperature profile of the plurality of second preliminary target temperatures, wherein the temperature decreasing interval is a time interval where the temperature of the hot plate decreases to a first temperature after the substrate is loaded on the hot plate, and wherein the temperature increasing interval is a time interval where the temperature of the hot plate increases from the first temperature to a target temperature; and controlling a temperature of the hot plate supporting the substrate on the basis of the reference so that the hot plate is controlled to have the plurality of first and second preliminary target temperatures over the course of stabilization to the target temperature.

2. The method of claim 1, wherein the plurality of first preliminary target temperatures of the reference are different from each other, wherein the plurality of second preliminary target temperatures of the reference are different from each other, and wherein the plurality of second preliminary target temperatures are lower than the target temperature.

3. The method of claim 1, wherein the hot plate includes a plurality of zones, and the reference is independently set for each of the plurality of zones.

4. The method of claim 1, wherein the reference is set in the form of an expression for temperature as a function of time.

5. The method of claim 1, wherein the reference is set in the form of a lookup table of the plurality of first and second preliminary target temperatures as a function of time.

6. A heat treatment apparatus of a substrate, the apparatus comprising:

a hot plate supporting the substrate;

a heater configured to heat the hot plate;

a temperature sensor configured to detect a temperature of the hot plate; and a controller configured to:

decrease a temperature of the hot plate to a first temperature according to a plurality of first preliminary target temperatures which decrease in a temperature decreasing interval such that the temperature of the substrate conforms to a temperature profile of the plurality of first preliminary target temperatures, and then increase the temperature of the hot plate from the first temperature to a target temperature according to a plurality of second preliminary target temperatures which increase in a temperature increasing interval such that the temperature of the substrate conforms to a temperature profile of the plurality of first preliminary target temperatures, wherein the temperature decreasing interval is a time interval where the temperature of the hot plate decreases to the first temperature after the substrate is loaded on the hot plate, and wherein the temperature increasing interval is a time interval where the temperature of the hot plate increases from the first temperature to the target temperature.

7. The heat treatment apparatus of claim 6, wherein the hot plate includes a plurality of channels, and the heater includes a plurality of sub-heaters each of which being disposed in a corresponding channel of the plurality of channels.

8. The heat treatment apparatus of claim 6, wherein the controller includes a storage unit for storing the plurality of first and second preliminary target temperatures.

9. The heat treatment apparatus of claim 6, wherein the plurality of first and second preliminary target temperatures are stored in the form of a lookup table of the plurality of first and second preliminary target temperatures as a function of time.

* * * * *